United States Patent
Matsudai et al.

(10) Patent No.: US 7,906,808 B2
(45) Date of Patent: Mar. 15, 2011

(54) SEMICONDUCTOR DEVICE

(75) Inventors: Tomoko Matsudai, Tokyo (JP); Norio Yasuhara, Kanagawa-ken (JP); Kazutoshi Nakamura, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 38 days.

(21) Appl. No.: 12/476,147

(22) Filed: Jun. 1, 2009

(65) Prior Publication Data
US 2010/0006936 A1  Jan. 14, 2010

(30) Foreign Application Priority Data

Jul. 9, 2008 (JP) ................................ 2008-178748

(51) Int. Cl.
H01L 29/76 (2006.01)
H01L 29/94 (2006.01)
H01L 31/062 (2006.01)
H01L 31/113 (2006.01)
H01L 31/119 (2006.01)

(52) U.S. Cl. ........................................ 257/328; 257/335
(58) Field of Classification Search .................. 257/328, 257/334, 335, 337, 338
See application file for complete search history.

(56) References Cited

U.S. PATENT DOCUMENTS
2006/0113592 A1 * 6/2006 Pendharkar et al. .......... 257/335

FOREIGN PATENT DOCUMENTS
| JP | H05-335566 | 12/1993 |
| JP | 2005-85959 | 3/2005 |
| JP | 2006-245482 | 9/2006 |
| JP | 2007-049039 | 2/2007 |
| JP | 2008-066508 | 3/2008 |
| JP | 2008-235933 | 10/2008 |

OTHER PUBLICATIONS

Japanese Office Action dated May 24, 2010, Japanese Patent Application No. 2008-178748.
Wang et al. "A Floating RESURF EDMOS with enhanced Safe Operating Area" IWPSD 2007, Dec. 2007.

* cited by examiner

*Primary Examiner* — Thien F Tran
(74) *Attorney, Agent, or Firm* — Patterson & Sheridan, LLP

(57) ABSTRACT

A semiconductor device includes a semiconductor layer of a first conductivity type; a deep well of a second conductivity type formed in a portion of an upper layer portion of the semiconductor layer; a well of the first conductivity type formed in a portion of an upper layer portion of the deep well; a source layer of the second conductivity type formed in the well; a drain layer of the second conductivity type formed in the well apart from the source layer; and a contact layer of the second conductivity type formed outside the well in an upper layer portion of the deep well and connected to the drain layer. The drain layer is electrically connected to the deep well via the well by applying a driving voltage between the source layer and the drain layer.

20 Claims, 8 Drawing Sheets

SD VOLTAGE = 0 V

SD VOLTAGE = DRIVE VOLTAGE

SD VOLTAGE = NEAR DEVICE BREAKDOWN VOLTAGE

SEMICONDUCTOR DEVICE

CROSS-REFERENCE TO RELATED APPLICATIONS

This application is based upon and claims the benefit of priority from the prior Japanese Patent Application No. 2008-178748, filed on Jul. 9, 2008; the entire contents of which are incorporated herein by reference.

BACKGROUND OF THE INVENTION

1. Field of the Invention

The present invention relates to a semiconductor device including a lateral field effect transistor.

2. Background Art

For an N-type LDMOS (Laterally Diffused Metal Oxide Semiconductor Field Effect Transistor) used as a high-side transistor of a DC-DC converter, technology is known that forms an N-type LDMOS inside a deep N well (DNW) by forming a DNW in a P-type semiconductor substrate, forming a P well in an upper layer portion of the DNW, and forming an N-type source layer and drain layer inside the P well (for example, JP-A 2006-245482 (Kokai)). Thus, the entire LDMOS is surrounded by the DNW, and the LDMOS can be electrically separated from the semiconductor substrate.

Normally, however, the DNW is replaced by a buried $N^+$ layer, and the well formation region is made by an epitaxial growth method. Forming the DNW as recited above by implantation and diffusion results in a lower impurity concentration than that of a buried $N^+$ layer, and the resistivity undesirably increases.

Accordingly, when increasing the surface area of an N-type LDMOS such as by alternately arranging source layers and drain layers, the DNW has a high resistance resulting in undesirable variation of the DNW potential by position. Therefore, it is difficult to obtain uniform characteristics in a device having a large surface area.

SUMMARY OF THE INVENTION

According to an aspect of the invention, there is provided a semiconductor device including: a semiconductor layer of a first conductivity type; a deep well of a second conductivity type formed in a portion of an upper layer portion of the semiconductor layer; a well of the first conductivity type formed in a portion of an upper layer portion of the deep well; a source layer of the second conductivity type formed in the well; a drain layer of the second conductivity type formed in the well apart from the source layer, wherein the drain layer is applied a driving voltage between the source layer and the drain layer, and electrically connects to the deep well via the well; a contact layer of the second conductivity type formed outside the well in an upper layer portion of the deep well and connected to the drain layer; a gate electrode provided in a region directly above a region between the source layer and the drain layer; a gate insulation film provided between the well and the gate electrode; and a drift layer of the second conductivity type formed in an upper layer portion of the well between the drain layer and a region directly below the gate electrode, wherein the drift layer has an effective impurity dose amount lower than an effective impurity dose amount of the drain layer.

DETAILED DESCRIPTION OF THE INVENTION

Hereinbelow, embodiments of the present invention are described with reference to the drawings.

First, a first embodiment of the present invention will be described.

Figure 1:
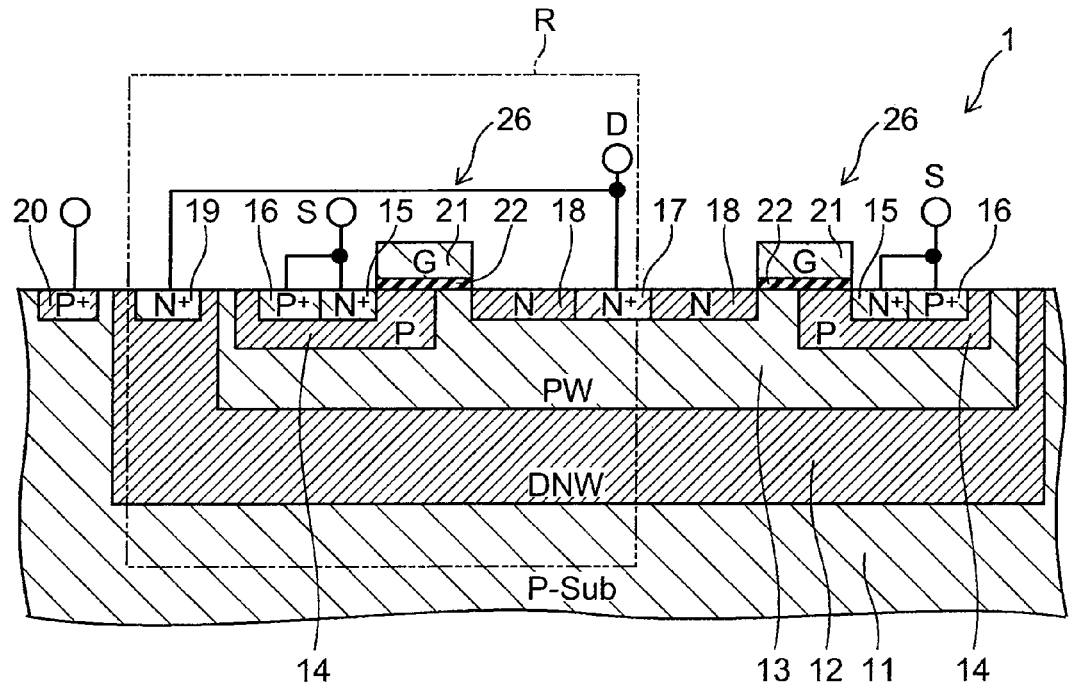
FIG. 1 is a cross-sectional view illustrating a semiconductor device according to a first embodiment of the invention.

FIG. 1 is a cross-sectional view illustrating a semiconductor device according to this embodiment.

Figure 2:
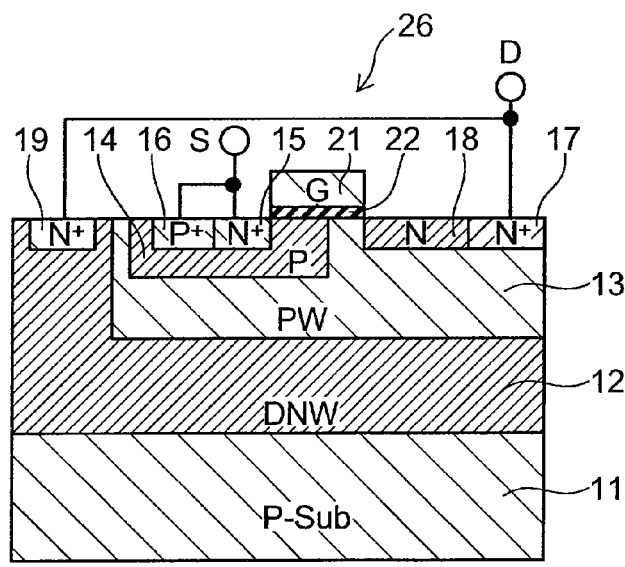
FIG. 2 is an enlarged cross-sectional view illustrating the region R of FIG. 1.

FIG. 2 is an enlarged cross-sectional view illustrating the region R of FIG. 1.

A P-type substrate 11 having a P-type conductivity is provided in the semiconductor device 1 according to this embodiment as illustrated in FIG. 1 and FIG. 2. The entire P-type substrate 11 may be formed by a uniform semiconductor layer; or only the upper layer portion may be a P-type semiconductor layer. The P-type substrate 11 is referred to as "P-Sub" in FIG. 1 and FIG. 2. A deep N well (DNW) 12 of an $N^+$-type conductivity is formed in a portion of the upper layer portion of the P-type substrate 11. A P well (PW) 13 is selectively formed in a portion of an upper layer portion of the DNW 12. Each of the DNW 12 and the P well 13 is formed by impurity implantation and diffusion. The effective dose amount of the P well 13 is, for example, not more than $1\times10^{13}$ cm$^{-2}$. "Effective dose amount" refers to the dose amount of impurities that actually contribute to conduction, in which the amount of acceptors and donors that cancel each other is excluded from the implanted dose amount.

A channel implantation region 14 (first conductivity-type region) of a P-type conductivity is formed in a portion of an upper layer portion of the P well 13. The effective impurity dose amount of the channel implantation region 14 is higher than that of the P well 13. For example, as illustrated in FIG. 1, channel implantation regions 14 are formed in two locations in one P well 13. The channel implantation region 14 extends like stripe in a direction perpendicular to the page surface of FIG. 1.

As illustrated in FIG. 1 and FIG. 2, a source layer 15 of the $N^+$-type conductivity is formed in a portion of an upper layer portion of each channel implantation region 14. A contact layer 16 of a $P^+$-type conductivity is formed in another portion of the upper layer portion of the channel implantation region 14. The source layer 15 and the contact layer 16 are connected to a common source electrode (not illustrated) and, for example, the source layer 15 contacts the contact layer 16.

On the other hand, a drain layer 17 of the $N^+$-type conductivity is formed in the upper layer portion of the P well 13 in a region apart from the channel implantation region 14. For example, as illustrated in FIG. 1, the drain layer 17 is disposed between a pair of channel implantation regions 14 and extends in a striped configuration along a direction perpendicular to the page surface of FIG. 1.

A drift layer 18 of an N-type conductivity is formed in a portion of the upper layer portion of the P well 13, located in a region on the source layer 15 side of the drain layer 17. In the example illustrated in FIG. 1, the drift layer 18 contacts the drain layer 17 but does not contact the channel implantation region 14; and the P well 13 exists between the drift layer 18 and the channel implantation region 14. The drift layer 18 may also contact the channel implantation region 14. The effective impurity dose amount of the drift layer 18 is lower than the effective impurity dose amount of the drain layer 17. An LDD (Lightly Doped Drain) region (not illustrated) is provided in a portion of the source layer 15 on the drain layer 17 side.

A contact layer 19 of the $N^+$-type conductivity is formed in the upper layer portion of the deep N well (DNW) 12 outside of the P well 13. The effective impurity concentration of the contact layer 19 is higher than that of the DNW 12. Assuming the specifications of the high side of a DC-DC converter, the contact layer 19 is connected to the drain layer 17 via a lead. Further, a contact layer 20 is formed in the P-type substrate 11 outside of the DNW 12 for applying a prescribed voltage to the P-type substrate 11. The contact layer 20 has the $P^+$-type conductivity and has an effective acceptor concentration higher than the effective acceptor concentration of the P-type substrate 11.

A gate electrode 21 is provided on the P-type substrate 11 in a region directly above a region between the source layer 15 and the drain layer 17, and more specifically, in a region directly above a region between the source layer 15 and the drift layer 18. The gate electrode 21 also extends like stripe in the same direction as the source layer 15 and the drain layer 17. In the example illustrated in FIG. 1, an outer edge of the channel implantation region 14 on the drift layer 18 side is positioned in a region directly below the gate electrode 21. When the drift layer 18 contacts the channel implantation region 14 as described above, the channel implantation region 14 may be formed along the entire region directly below the gate electrode 21. A gate insulation film 22 is provided between the P well 13 and the gate electrode 21.

Thus, an N-type LDMOS 26 has the P well 13, the channel implantation region 14, the source layer 15, the contact layer 16, the drain layer 17, the drift layer 18, the contact layer 19, the gate electrode 21, and the gate insulation film 22. The N-type LDMOS 26 is surrounded by the DNW 12 and electrically separated from other regions on the P-type substrate 11.

An operation of the semiconductor device according to this embodiment will now be described.

Figure 3:
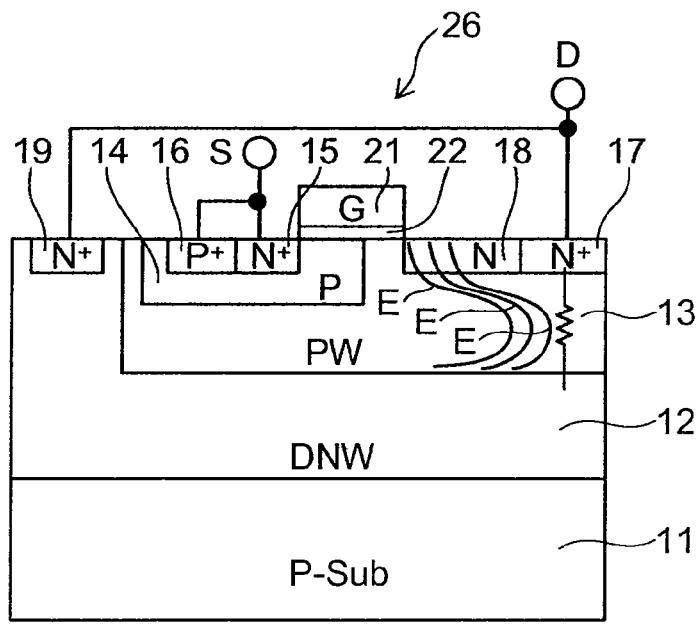
FIG. 3 is a cross-sectional view illustrating an operation of the semiconductor device according to the first embodiment.

FIG. 3 is a cross-sectional view illustrating an operation of the semiconductor device according to this embodiment.

As illustrated in FIG. 3, a driving voltage is applied between the source layer 15 and the drain layer 17, and an off voltage is applied to the gate electrode 21. Thus, a voltage lower than the threshold voltage of the N-type LDMOS 26 is applied to the gate electrode 21. The N-type LDMOS 26 is an OFF state. A negative source potential is applied to the source layer 15. And a positive drain potential is applied to the drain layer 17. That is a state in which the source potential is applied also to the channel implantation region 14 and the P well 13 via the contact layer 16 when a reverse-biased voltage is applied. The drain potential is applied also to an end portion of the DNW 12 via the contact layer 19. The "negative" and "positive" recited above refer to a relative potential relationship. "Negative" does not necessarily refer to a potential lower than grounding potential, and, for example, may be the grounding potential (zero potential).

The positive drain potential applied to the $N^+$-type drain layer 17 and the DNW 12. And the negative source potential applied to the P well 13. Therefore, a depletion layer to extend upward and downward from an interface between the drain layer 17 and the P well 13. The depletion layer extends mainly into the P well 13 which has a relatively low impurity concentration. In other words, a depletion layer (first depletion layer) extends downward. On the other hand, a depletion layer extends upward and downward from an interface between the DNW 12 and the P well 13, but mainly into the P well 13 which has a relatively lower impurity concentration. In other words, a depletion layer (second depletion layer) extends upward. Then, the second depletion layer contacts the first depletion layer and connects it, thereby electrically connecting the drain layer 17 and the DNW 12 via the P well 13. At this time, the drain layer 17 and the DNW 12 have the same potential. Although current does not flow therebetween, in the present specification, this state is called "punch through between the drain layer 17 and the DNW 12" (also called "vertical direction punch through") for convenience.

As a result, the drain potential is applied to a portion of the DNW 12 corresponding to a region directly below the drain layer 17. Punch through between the drain layer 17 and the DNW 12 may be caused by, for example, reducing the effective impurity concentration of the P well 13. The depletion layer thereby extends readily in the P well 13, and vertical direction punch through occurs readily. For example, as described above, the effective dose amount of the P well 13 is assumed to be not more than $1\times10^{13}$ cm$^{-2}$.

In the source region of the LDMOS 26, i.e., the source layer 15 and the region proximal thereto, a depletion layer does not extend from the interface between the source layer 15 and the channel implantation region 14 due to the negative source potential applied to the $N^+$-type source layer 15. A depletion layer extends upward and downward only from the interface between the DNW 12 and the P well 13 in this region. But the P-type region directly below the source layer 15, that is, the P well 13 and the channel implantation region 14, do not completely deplete. Because the source layer 15 is surrounded by the P-type channel implantation region 14 which has an effective impurity concentration higher than that of the P well 13. In other words, the P well 13 completely depletes in the drain region but does not deplete in the source region. The drift layer 18 has an impurity concentration so as to deplete when the reverse bias is applied. Accordingly the drift layer 18 is provided to maintain the breakdown voltage in the horizontal direction of the device. Due to these relationships, an end portion of the depletion layer in the P well 13 often extends partway through the drift region 18. The curves in FIG. 3 schematically illustrate equipotential surfaces of such a state. Thus, FIG. 3 shows that a continuous depletion layer is not formed and punch through (hereinbelow referred to also as "horizontal direction punch through") does not occur between the source layer 15 and the drain layer 17.

Generally, an LDMOS is designed e to cause the drift region 18 to deplete and appropriately distribute the voltage between the source and the drain along the depleted region as described above. Therefore, the desired device breakdown voltage of the device is realized. However, if a P well and a drain layer of a CMOS are used in the semiconductor device 1, the impurity concentration thereof is often too high. Thus the device breakdown voltage undesirably is determined by the junction breakdown voltage directly below the drain layer 17, that is, between the P well 13 and the drain layer 17. The drift region 18 is appropriately designed according to the impurity concentration and length appropriately, it is impossible to achieve a breakdown voltage greater than the junction breakdown voltage between the P well 13 and the drain layer 17.

However, in the case where the vertical direction punch through occurs between the drain layer 17 and the DNW 12 at not more than the junction breakdown voltage between the P well 13 and the drain layer 17, the device breakdown voltage is not affected by the junction breakdown voltage. Accordingly, the device breakdown voltage can be determined by the design of the drift region 18.

It is also possible to increase the junction breakdown voltage with the drain layer 17 by decreasing the concentration of the P well 13. But, such a method requires additional steps for formation of the P well 13 apart from the steps for formation of the P well of the existing CMOS. Thus, manufacturing steps and costs of the device 1 are undesirably increased.

Therefore, operations such as those of this embodiment are desired to form a LDMOS having a high breakdown voltage and to avoid increasing manufacturing steps as much as possible.

In this embodiment, the same potential is obtained in the DNW 12 and the portion in which vertical direction punch through occurs in the drift layer 18, the drain layer 17, and the P well 13. Equipotential surfaces E thereby form curves along the outer edge of these regions. Electric field concentration is thereby relieved between the drain layer 17 and the P well 13. As a result, the junction breakdown voltage improves even more between the drain layer 17 and the P well 13.

Effects of this embodiment will now be described.

In this embodiment, the vertical direction punch through occurs between the drain layer 17 and the DNW 12. Thus the drain potential can be applied to a portion of the DNW 12 corresponding to a region directly below the drain layer 17. Therefore, even in the case where the surface area of the DNW 12 is large, variation of the potential in the DNW 12 by position is inhibited. Thus the potential of the DNW 12 can be made uniform. As a result, uniform characteristics can be obtained over the entire N-type LDMOS 26 even for a large device surface area. For example, even in the case where multiple source layers 15 and drain layers 17 are alternately arranged to increase the current driving capacity of the N-type LDMOS 26, a uniform potential is possible over the entire DNW 12. Because the drain potential can be applied to the DNW 12 via the depletion layers from each drain layer 17 in addition to the contact layer 19.

In this embodiment, an effective acceptor concentration of the P well 13 is low and the channel implantation region 14 that has high concentration and surrounds the source layer 15 but does not surround the drain layer 17. Thus only vertical direction punch through is caused but horizontal direction punch through. But the present invention is not limited thereto. For example, a channel implantation region 14 may not be provided, and the distance between the source layer 15 and the drain layer 17 may be increased. In such a configuration as well, horizontal direction punch through does not occur when a prescribed source-drain drive voltage is applied. In other words, the N-type LDMOS 26 of this embodiment is driven by applying a voltage (driving voltage) between the source layer 15 and the drain layer 17 such that punch through does not occur between the source layer 15 and the drain layer 17, while punch through occurs between the drain layer 17 and the DNW 12.

In this embodiment, electric field concentration is relieved by providing the drift layer 18, and the breakdown voltage between the drain layer 17 and the P well 13 can be improved. Thereby, vertical direction punch through can be caused to occur at a voltage lower than the breakdown voltage.

Further, this embodiment does not provide a special structure between the drain layer 17 and the DNW 12 to cause vertical direction punch through. So it does not occur for shifting a mask positions during the formation of such structures. Therefore, problems due to variation of characteristics of the N-type LDMOS 26 resulting from the shifting are avoided.

Examples of this embodiment and comparative examples will now be described to illustrate more specifically the effects of this embodiment described above.

First, an example of this embodiment will be described.

Figure 4:
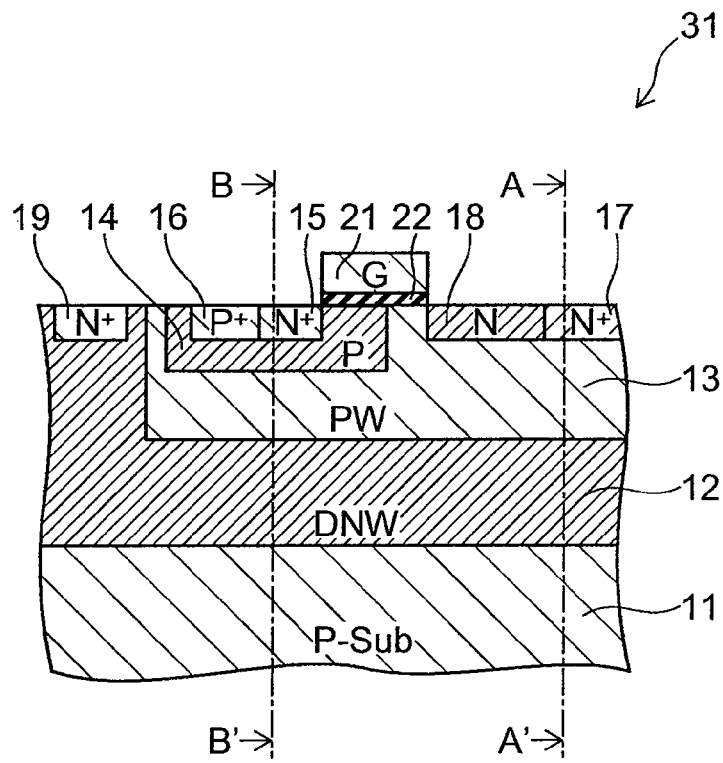
FIG. 4 is a cross-sectional view illustrating a semiconductor device according to an example of the first embodiment.

FIG. 4 is a cross-sectional view illustrating a semiconductor device according to this example.

Figure 5A:
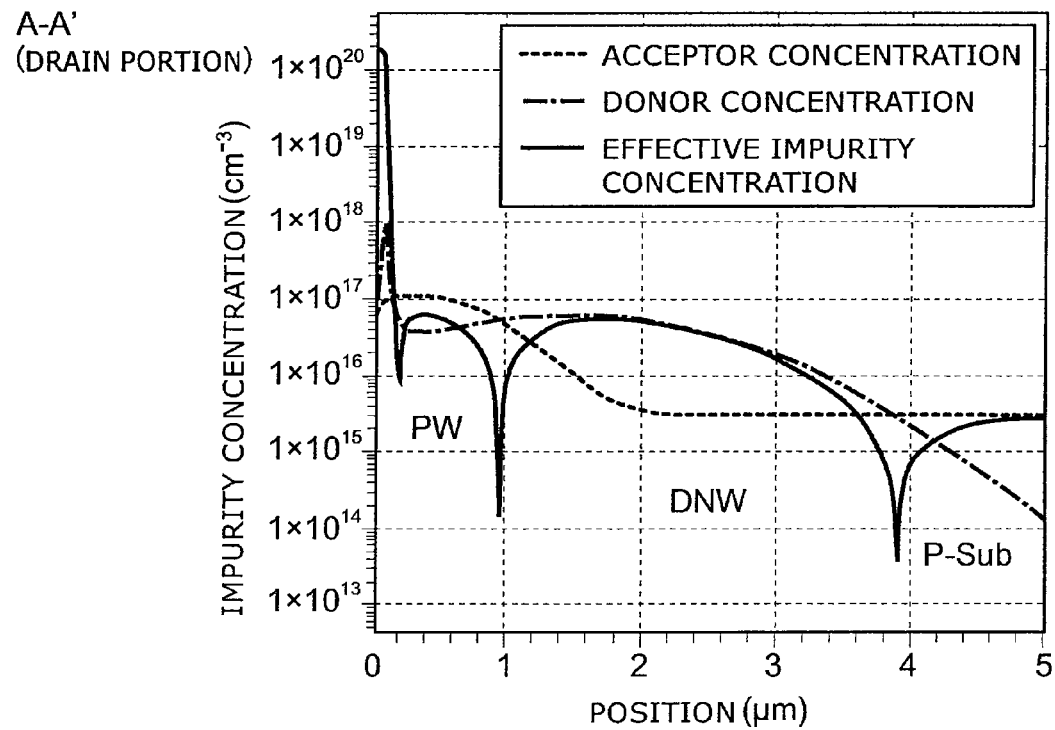
FIGS. 5A and 5B are graphs illustrating impurity concentration profiles of the semiconductor device, where the horizontal axis is the position along the device depth direction, and the vertical axis is the impurity concentration.
Figure 5B:
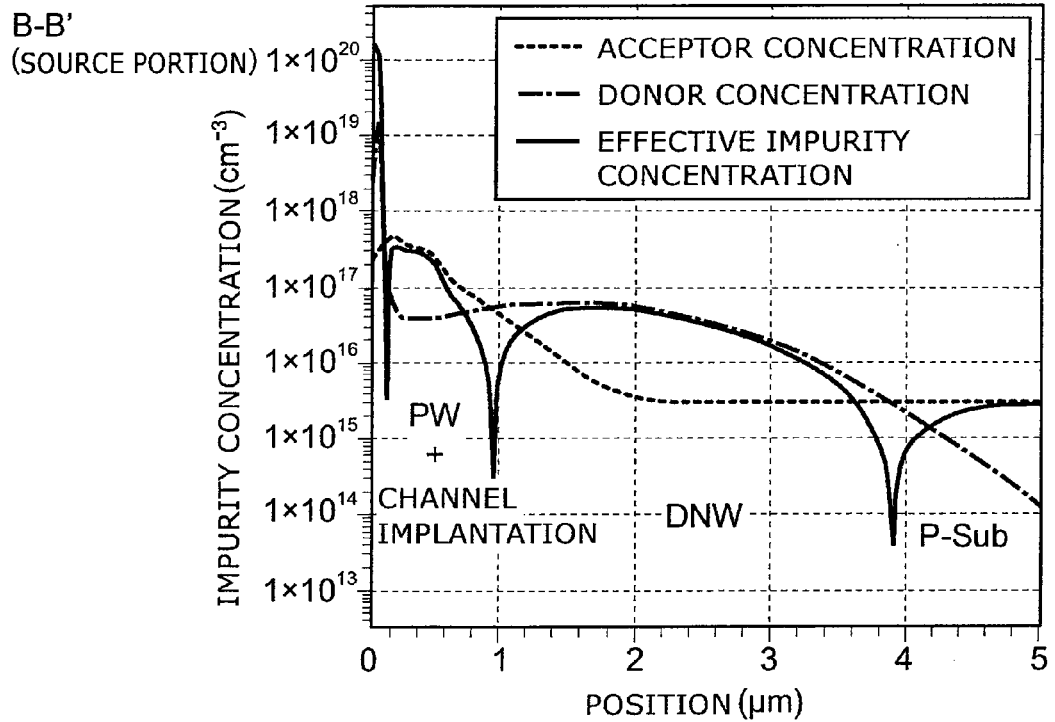

FIGS. 5A and 5B are graphs illustrating impurity concentration profiles of the semiconductor device, where the horizontal axis is the position along the device depth direction, and the vertical axis is the impurity concentration. FIG. 5A illustrates the profile along line A-A' of FIG. 4, and FIG. 5B illustrates the profile along line B-B' of FIG. 4.

In FIGS. 5A and 5B, the broken line represents the acceptor concentration, the single dot-dash line represents the donor concentration, and the solid line represents the effective impurity concentration.

In a semiconductor device 31 according to this example as illustrated in FIG. 4 and FIGS. 5A and 5B, the P well 13 is formed by implanting acceptors to overlay on the DNW 12, and the effective impurity amount of the P well 13 is therefore reduced, after forming it. In the region on the source layer 15 side, acceptors in the P well 13 are implanted again to form the channel implantation region 14. Therefore, the acceptor concentration is further reinforced; and it is possible to prevent defects such as latch up.

In the semiconductor device 31 of the example as illustrated in FIGS. 5A and 5B, the effective impurity concentration of the P-type substrate 11 is about $3 \times 10^{15}$ cm$^{-3}$. The peak value of the effective impurity concentration of the DNW 12 and the P well 13 is about $5 \times 10^{16}$ cm$^{-3}$. The effective impurity concentration of the channel implantation region 14 is about $3 \times 10^{17}$ cm$^{-3}$. And the effective impurity concentration of the source layer 15 and the drain layer 17 is about $2 \times 10^{20}$ cm$^{-3}$.

An operation of this example will now be described.

Figure 6A:
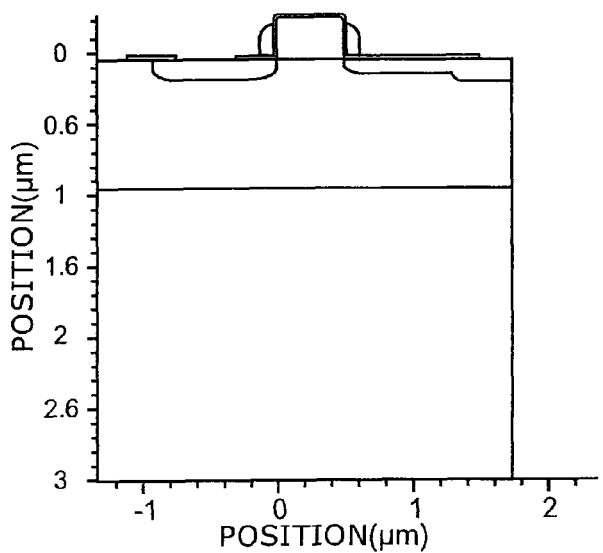
FIGS. 6A to 6C illustrate simulation results of the electric field distribution in the semiconductor device according to the example of the first embodiment.
Figure 6B:
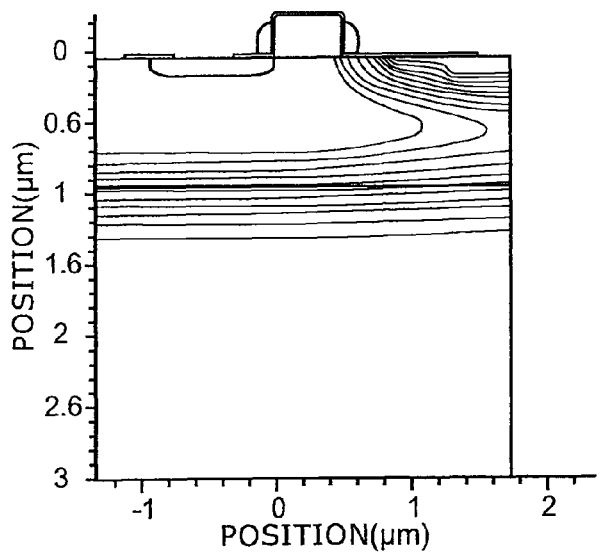
Figure 6C:
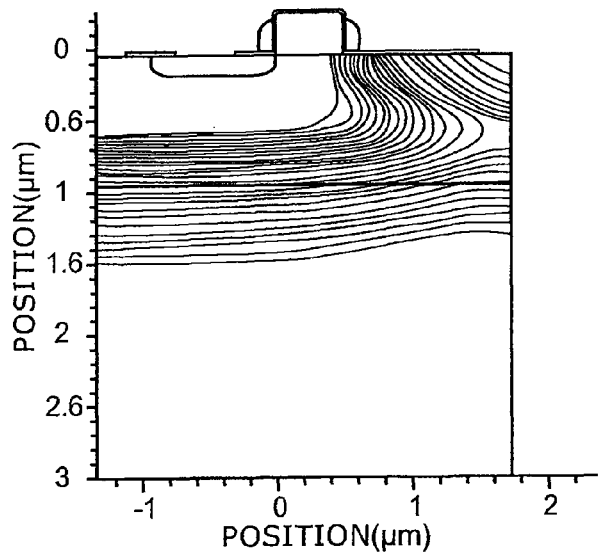

FIGS. 6A to 6C illustrate simulation results of the electric field distribution in the semiconductor device according to this example. FIG. 6A illustrates the case where the source-drain voltage (hereinbelow referred to as "SD voltage") is 0 V. FIG. 6B illustrates the case where the SD voltage is a normal drive voltage. FIG. 6C illustrates the case where the SD voltage is a high voltage near the device breakdown voltage.

The regions illustrated in FIGS. 6A to 6C nearly correspond to the regions illustrated in FIG. 4.

As illustrated in FIG. 6A, in the case where the SD voltage is 0 V, the potential in the semiconductor device 31 is uniform. Conversely, as illustrated in FIG. 6B, in the case where the SD voltage is applied, vertical direction punch through occurs between the drain layer 17 and the DNW 12 illustrated in FIG. 4. And the drain layer 17 is electrically connected to the DNW 12 via the depletion layers occurring in the P well 13. As a result, an equipotential surface is formed from the DNW 12 to the region depleted in each of the P well 13, the drain layer 17, and the drift layer 18. As illustrated in FIG. 6C, even in the case where the SD voltage is increased near the breakdown voltage of the device, the density of the equipotential surfaces increases. But the shape of the equipotential surfaces does not change much. Therefore, no region appears having particularly dense equipotential surfaces. And a high breakdown voltage can be obtained. Moreover, the length of the drift layer 18 can be designed to the minimal necessary length for the target breakdown voltage, and the ON resistance of the device can therefore be reduced.

Thus, when a source-drain drive voltage is applied in the semiconductor device 31 according to this example, vertical direction punch through occurs. The punch through continues to stably exist near the limitation of the device breakdown voltage. Thus, this example stably provides the effects recited for the embodiment described above.

A first comparative example of this embodiment will now be described.

Figure 7:
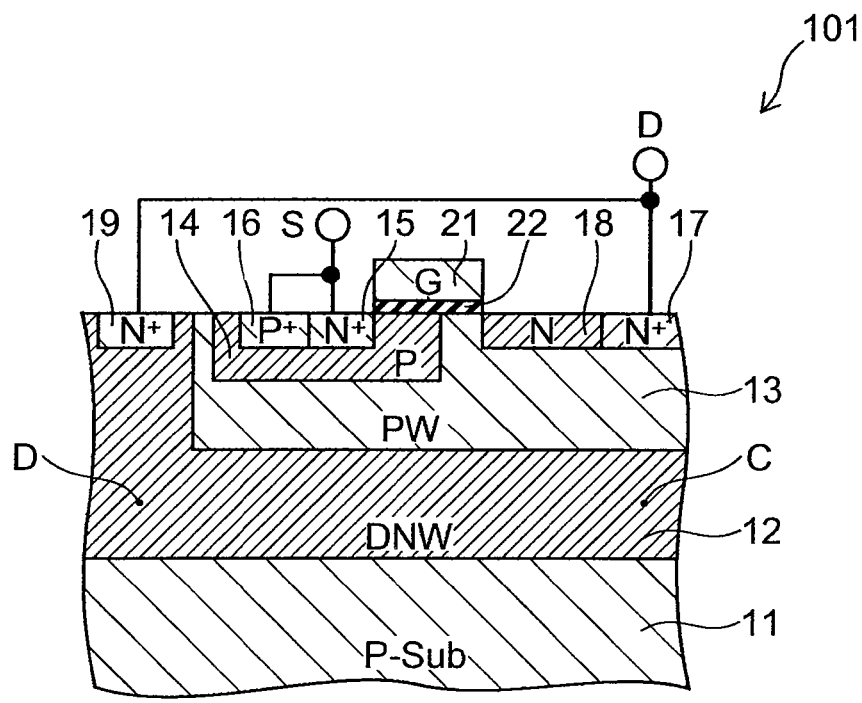
FIG. 7 is a cross-sectional view illustrating a semiconductor device according to a first comparative example of the first embodiment.

FIG. 7 is a cross-sectional view illustrating a semiconductor device according to this comparative example.

As illustrated in FIG. 7, the layer structure of a semiconductor device 101 according to this comparative example is similar to the layer structure of the semiconductor device 1 according to this embodiment described above. But the effective impurity concentration of the P well 13 of the semiconductor device 101 is higher than that of the semiconductor device 1. Therefore, when the N-type LDMOS 26 is in a non-conducting state, vertical direction punch through does not occur between the drain layer 17 and the DNW 12.

In such a semiconductor device 101, the drain potential is applied to the DNW 12 only via the contact layer 19 formed in the end portion of the DNW 12. The potential is therefore undesirably different between an end portion D and a central portion C of the DNW 12. The characteristics of the N-type LDMOS 26 therefore may vary by its position. Such an aptitude becomes prominent as the effective impurity concentration decreases and the resistivity increases for the DNW 12. Such a trend also becomes prominent as the width of the DNW 12 increases.

The drain layer 17 is not connected the DNW 12 by vertical direction punch through in the semiconductor device 101, and therefore equipotential surfaces E form along surfaces of the drift layer 18 and the drain layer 17. The electric field therefore concentrates in corner portions of the drift layer 18. So that the breakdown voltage of these portions undesirably decreases.

A second comparative example of this embodiment will now be described.

Figure 8:
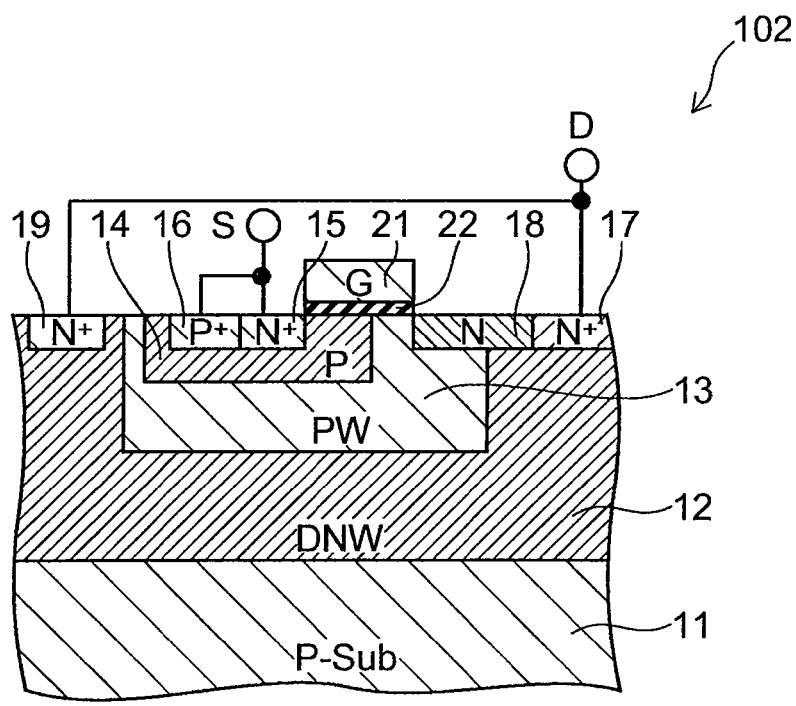
FIG. 8 is a cross-sectional view illustrating a semiconductor device according to a second comparative example of the first embodiment.

FIG. 8 is a cross-sectional view illustrating a semiconductor device according to this comparative example.

As illustrated in FIG. 8, in a semiconductor device 102 according to this comparative example, the P well 13 is not formed in a region directly below the entire drain layer 17 and a portion of the drift layer 18 on the drain layer 17 side. And the DNW 12 extends upward. The DNW 12 thereby contacts the entire drain layer 17 and the portion of the drift layer 18 on the drain layer 17 side.

The drain layer 17 contacts the DNW 12 in the semiconductor device 102 according to this comparative example. Therefore, the drain potential can apply to the DNW 12 via the drain layer 17 due to the electrical connection of this portion. The potential of the DNW 12 can thereby be made uniform. Further, curved equipotential surfaces are formed from the drain layer 17 to the DNW 12 to detour around the P well 13. Thereby electric field concentration is relieved and the breakdown voltage improves.

However, donors in the drift layer 18 are cancelled by acceptors in the P well 13. The effective dose amount of the drift layer 18 therefore depends on the length of the overlaid portion of the drift layer 18 and the P well 13. The interface between the P well 13 and the extended portion of the DNW 12 is positioned directly below the drift layer 18 in this comparative example. Therefore, when a forming mask for the P well 13 shifts to inapplicable position, the length of the overlaid portion varies. The effective dose amount of the drift layer 18 may differ. As a result, device characteristics such as breakdown voltage and ON resistance vary.

The semiconductor device 102 must therefore be designed to allow for position shifts of the mask. In other words, specifications of the device must be set to allow for variation of the device characteristics. Or a larger size of the device must be designed to allow for a positioning margin of the mask. But even if the device is designed above, the N-type LDMOS 26 may have excessive specifications or increase the ON resistance because of the larger surface.

Conversely, according to the example of this embodiment, the drain layer 17 is electrically connected to the DNW 12 by punch through. Therefore, it is not necessary to terminate the P well 13 in a region directly below the drift layer 18. So the device characteristics do not vary because mask position does not shift during the P well 13 formation. It is therefore not necessary to design a device with an excessive size or excessive specifications.

A second embodiment of the present invention will now be described.

Figure 9:
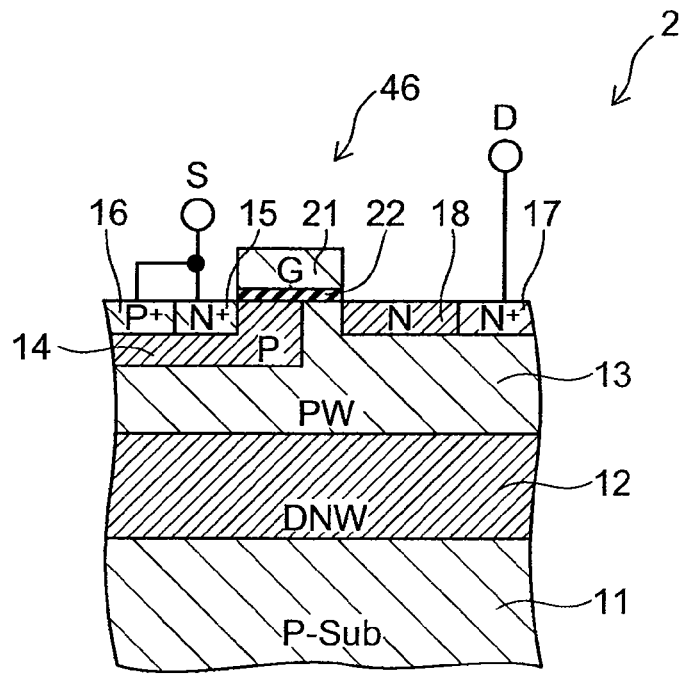
FIG. 9 is a cross-sectional view illustrating a semiconductor device according to the second embodiment of the invention, i.e. illustrating an N-type LDMOS that is different from the N-type LDMOS illustrated in FIG. 1.

FIG. 9 is a cross-sectional view illustrating a semiconductor device according to this embodiment. An N-type LDMOS illustrated in FIG. 9 is different than the N-type LDMOS illustrated in FIG. 1.

In the semiconductor device 2 according to this embodiment, the N-type LDMOS 26 illustrated in FIG. 1 is provided in a region of a portion of the P-type substrate 11, and an N-type LDMOS 46 illustrated in FIG. 9 is provided in a region in another portion of the P-type substrate 11. The N-type LDMOS 26 forms a high-side transistor of a DC-DC converter, and the N-type LDMOS 46 forms a low-side transistor of the DC-DC converter.

As illustrated in FIG. 9, in the N-type LDMOS 46, the contact layer 19 (of FIG. 1) is not provided to apply the drain potential to the DNW 12. The DNW 12 illustrated in FIG. 9 continues from the DNW 12 illustrated in FIG. 1. And the drain potential of the N-type LDMOS 26 is applied to the DNW 12. Otherwise, the configuration of the N-type LDMOS 46 is similar to the configuration of the N-type LDMOS 26 illustrated in FIG. 1. In other words, each of the P well 13, the channel implantation region 14, the source layer 15, the contact layer 16, the drain layer 17, and the drift layer 18 illustrated in FIG. 9 are different components from those illustrated in FIG. 1, respectively But those components are formed simultaneously with the components illustrated in FIG. 1. Therefore those components have substantially the same depths and dose amounts, respectively.

An operation of this embodiment will now be described.

In the N-type LDMOS 26 that forms the high-side transistor of the DC-DC converter, an input potential of the DC-DC converter is applied to the drain layer 17 as a drain potential. For example, this input potential is a positive potential of +5 V. At this time, the input potential of +5 V is applied also to the DNW 12 via the contact layer 19. Meanwhile, in the N-type LDMOS 46 that forms the low-side transistor of the DC-DC converter, a reference potential of the DC-DC converter is applied to the source layer 15 as a source potential. For example, this reference potential is a grounding potential of 0 V. The source layer 15 of the N-type LDMOS 26 is connected to the drain layer 17 of the N-type LDMOS 46.

When the N-type LDMOS 26 that forms the high-side transistor is in an OFF state and the N-type LDMOS 46 that forms the low-side transistor is in an ON state, vertical direction punch through occurs in the N-type LDMOS 26 due to an operation similar to that of the first embodiment described above. And the drain potential (input potential) is applied to the DNW 12. At this time, the drain potential of the N-type LDMOS 46 is nearly 0 V, and therefore vertical direction punch through does not occur in the N-type LDMOS 46.

When the N-type LDMOS 26 that forms the high-side transistor is in the ON state and the N-type LDMOS 46 that forms the low-side transistor is in the OFF state, the source potential of the N-type LDMOS 26 is nearly +5 V, and the SD voltage is nearly 0 V. Therefore, a state such as that illustrated in FIG. 6A is reached in the N-type LDMOS 26. So vertical direction punch through does not occur in the N-type LDMOS 26. In the N-type LDMOS 46, the drain potential is nearly +5 V, and the source potential is 0 V. But a drain potential is applied to the DNW 12 via only the contact layer 19 (of FIG. 1) formed in the N-type LDMOS 26 formation region. Therefore, the potential of the DNW 12 in the region in which the N-type LDMOS 46 is formed drops considerably from +5 V. Therefore, vertical direction punch through does not occur in the N-type LDMOS 46.

According to this embodiment, a high-side transistor and a low-side transistor can be formed on one P-type substrate 11 using deep N wells (DNW) 12, P wells 13, and the like having common specifications. Otherwise, operations and effects of this embodiment are similar to those of the first embodiment described above.

A modification of the second embodiment will be described.

Figure 10:
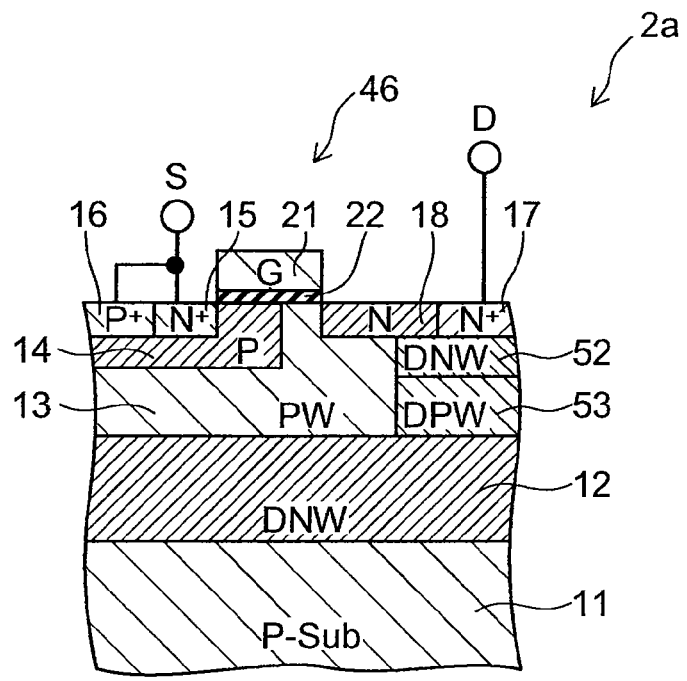
FIG. 10 is a cross-sectional view illustrating a semiconductor device according to a modification of the second embodiment, i.e. illustrating an N-type LDMOS that forms a low-side transistor.

FIG. 10 is a cross-sectional view illustrating a semiconductor device according to this modification. An N-type LDMOS illustrated in FIG. 10 forms a low-side transistor.

As illustrated in FIG. 10, in the N-type LDMOS 46 that forms the low-side transistor in a semiconductor device 2a according to this modification, a deep N well (DNW) 52 is formed in a region directly below the entire drain layer 17 and a portion of the drift layer 18 on the drain layer 17 side. A deep P well (DPW) 53 is formed in a region directly below the DNW 52. The DPW 53 contacts the DNW 12. Otherwise, the configuration, operations, and effects of this modification are similar to those of the second embodiment described above.

A third embodiment of the present invention will be described.

Figure 11:
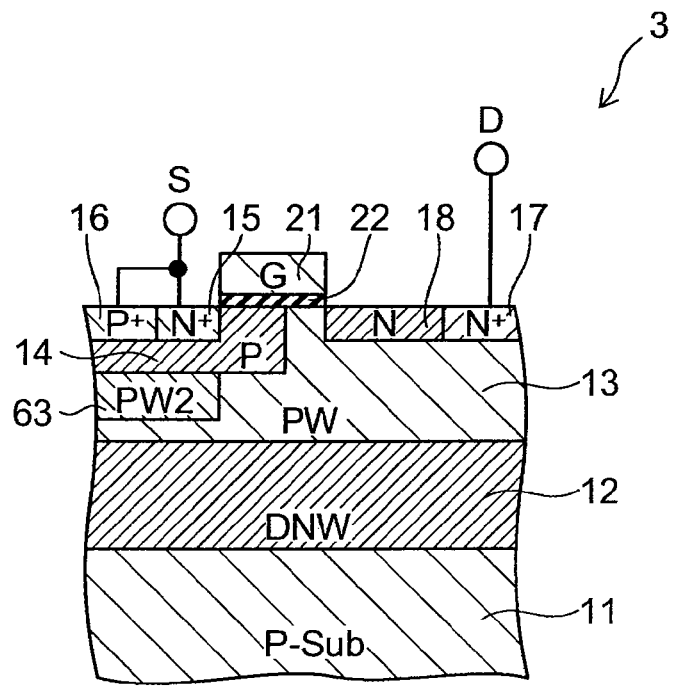
FIG. 11 is a cross-sectional view illustrating a semiconductor device according to a third embodiment of the invention.

FIG. 11 is a cross-sectional view illustrating a semiconductor device according to this embodiment.

As illustrated in FIG. 11, a semiconductor device 3 according to this embodiment includes, in addition to the configuration of the semiconductor device 1 (of FIG. 1 and FIG. 2) according to the first embodiment described above, a P well 63. The P well 63 is formed in a portion in a region of the P well 13 directly below the channel implantation region 14. And the P well 63 contacts the channel implantation region 14. The P well 63 has the P-type conductivity. The effective impurity concentration of the P well 63 is higher than the effective impurity concentration of the P well 13.

According to this embodiment, the P well 63 is additionally formed in the P well 13, thereby reinforcing the effective acceptor concentration in the region of the P well 13 on the source side. Defects such as latch up can thereby be avoided more reliably. Otherwise, the configuration, operations, and effects of this embodiment are similar to those of the first embodiment described above.

A fourth embodiment of the present invention will be described.

Figure 12:
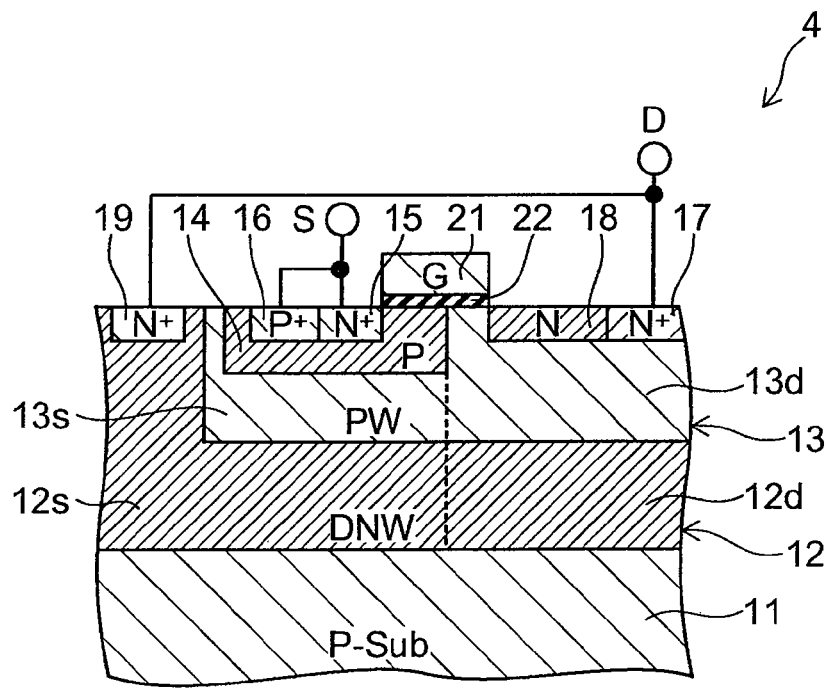
FIG. 12 is a cross-sectional view illustrating a semiconductor device according to a forth embodiment of the invention.

FIG. 12 is a cross-sectional view illustrating a semiconductor device according to this embodiment.

As illustrated in FIG. 12, in a semiconductor device 4 according to this embodiment, the DNW 12 is divided into a drain-side region 12d and a source-side region 12s. The effective impurity concentration of the drain-side region 12d is higher than that of the source-side region 12s. The P well 13 also is divided into a drain-side region 13d and a source-side region 13s. The effective impurity concentration of the drain-side region 13d is lower than that of the source-side region 13s. Therefore, the effective impurity concentration of a portion of the P well 13 corresponding to a region directly below the drain layer 17 is lower than that of a portion of the P well 13 corresponding to a region directly below the source layer 15. Otherwise, the configuration of this embodiment is similar to that of the semiconductor device 1 (of FIG. 1 and FIG. 2) according to the first embodiment described above.

A method for manufacturing the semiconductor device according to this embodiment will be described.

Figure 13:
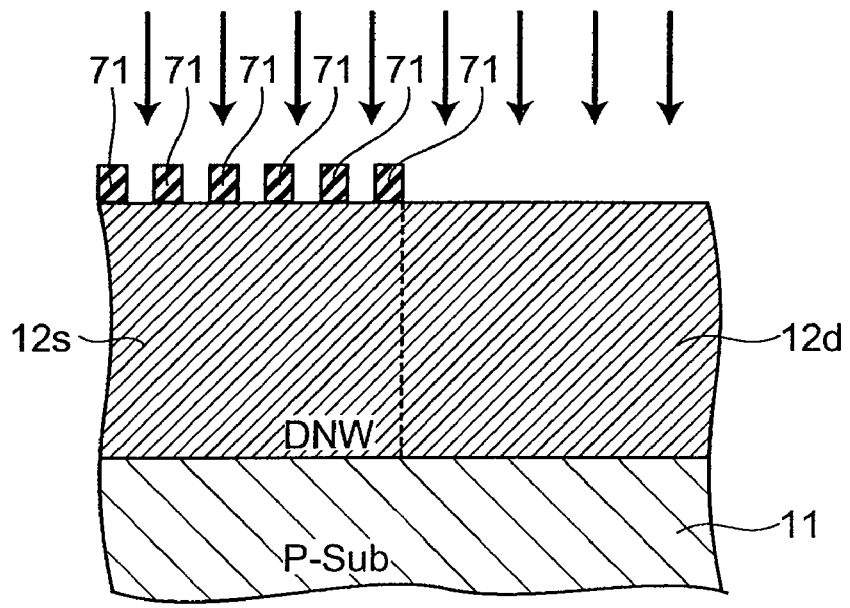
FIG. 13 is a cross-sectional view of a step illustrating the method for manufacturing the semiconductor device according to the forth embodiment.

FIG. 13 is a cross-sectional view of a step illustrating the method for manufacturing the semiconductor device according to this embodiment.

As illustrated in FIG. 13, the P-type substrate 11 formed by, for example, single crystal silicon (Si) is provided. Resist blocks 71 are formed on an upper surface of the P-type substrate 11 only in a region on the source side. The resist block 71 has a slit configuration. The resist blocks 71 are then used as a mask, and donors, for example, phosphorus (P), are ion-implanted into an upper layer portion of the P-type substrate 11. The dose amount of the donors implanted into the region on the source side is thereby lower than that implanted into the region on the drain side.

Then, the resist blocks 71 are removed. Next, heat treatment is performed to diffuse the implanted donors. Therefore, the donor concentrations in the region on the source side and the region on the drain side are made uniform, respectively. Here, the arrangement period of the resist blocks 71 is sufficiently small to avoid effects of the arrangement period of the resist blocks 71 on the donor concentration distribution of the region 12s after the thermal diffusion processing. Thus, the DNW 12 is formed in the upper layer portion of the P-type substrate 11. And the donor concentration of the region 12s of the DNW 12 on the source side is lower than the donor concentration of the region 12d on the drain side.

Continuing, acceptors are ion-implanted into an upper layer portion of the DNW 12 to form the P well 13. At this time, the dose amount of the acceptors in the region on the source side is substantially the same to that in the region on the drain side. But the acceptors implanted into the region on the drain side are cancelled by donors in the DNW 12 more so than those in the region on the source side. As a result, the effective impurity concentration of the region 13d of the P well 13 on the drain side is lower than that of the region 13s on the source side.

Then, as illustrated in FIG. 12, the regions and layers are formed by normal methods. And the gate insulation film 22, the gate electrode 21, and so on, are formed by normal methods. Therefore the semiconductor device 4 according to this embodiment can be manufactured.

In this embodiment, the effective impurity concentration of the region 13d of the P well 13 on the drain side is lower than that of the region 13s on the source side. Therefore, vertical direction punch through readily occurs between the drain layer 17 and the region 12d of the DNW 12 on the drain side. Wider ranges of thickness, impurity concentration, etc., of the P well 13 are therefore permissible. In the case where the N-type LDMOS 26 is formed with another CMOS device in the semiconductor device 4, the thickness, impurity concentration, and the like of the P well are often determined by the design of the CMOS. Therefore, in the case where the degree of freedom for design of the P well improves, the degree of freedom for design of the entire semiconductor device improves. Otherwise, operations and effects of this embodiment are similar to those of the first embodiment described above.

A fifth embodiment of the present invention will be described.

Figure 14:
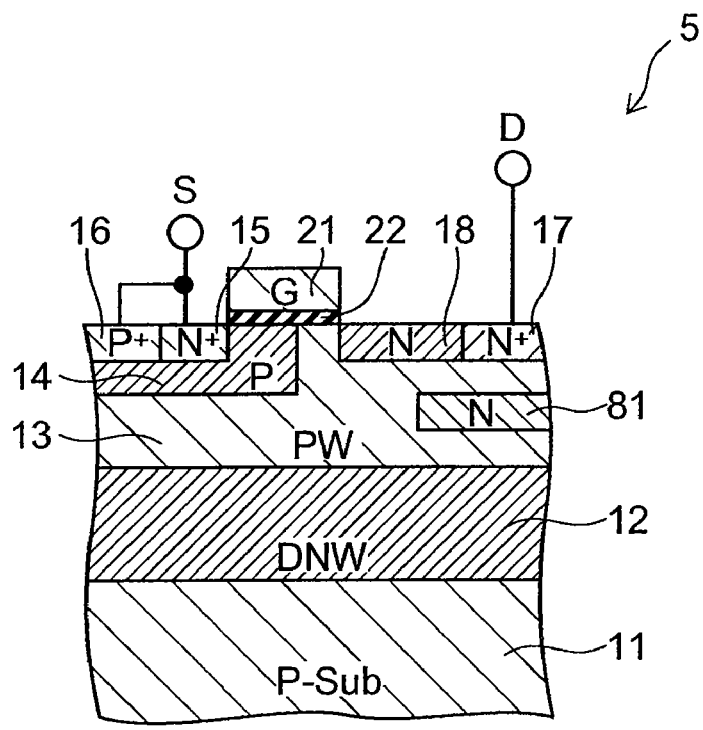
FIG. 14 is a cross-sectional view illustrating a semiconductor device according to a fifth embodiment of the invention.

FIG. 14 is a cross-sectional view illustrating a semiconductor device according to this embodiment.

As illustrated in FIG. 14, a semiconductor device 5 according to this embodiment includes, in addition to the configuration of the semiconductor device 1 (of FIG. 1 and FIG. 2) according to the first embodiment described above, an N-type region 81. The N-type region 81 has the N-type conductivity. And the N-type region 81 is provided between the DNW 12 and the entire drain layer 17 and a portion of the drift layer 18 on the drain layer 17 side. The N-type region 81 is surrounded by the P well 13. And the N-type region 81 does not contact the drain layer 17, the drift layer 18, and the DNW 12. Thus, the N-type region 81 is in a floating state.

The N-type region 81 may be formed by forming resist blocks using a dedicated mask and then performing ion implantation of donors using the resist blocks as a mask. Also, the drift layer 18 may be divided into a two-part configuration that has a portion on the drain side and a portion on the source side. And the portion on the drain layer side is formed with a relatively high impurity concentration. The portion on the source side is formed with a relatively low impurity concentration. And the N-type region 81 may be formed with a mask that is used for ion implantation of donors into the portion on the drain side.

In this embodiment, the N-type region 81 is provided in the P well 13. Thus a depletion layer readily extends between the drain layer 17 and the DNW 12. And vertical direction punch through readily occurs. Wider ranges of thickness, impurity concentration, etc., of the P well 13 are therefore permissible and the degrees of freedom during design of the semiconductor device improve. Otherwise, the configuration, operations, and effects of this embodiment are similar to those of the first embodiment described above.

Hereinabove, the present invention is described with reference to embodiments. However, the present invention is not limited to the embodiments. One skilled in the art may appropriately perform additions or exclusions of components or design modifications to the embodiments described above and all such additions, exclusions, and modifications also are within the scope of the present invention to the extent that the spirit of the present invention is included. For example, an N-channel LDMOS is shown as an example in the embodiments described above, but the present invention also may be applied to a P-channel LDMOS. Furthermore, the semiconductor device according to the present invention is not limited to a DC-DC converter.

The invention claimed is:

1. A semiconductor device comprising:
a semiconductor layer of a first conductivity type;
a deep well of a second conductivity type formed in a portion of an upper layer portion of the semiconductor layer;
a well of the first conductivity type formed in a portion of an upper layer portion of the deep well;
a source layer of the second conductivity type formed in the well;
a drain layer of the second conductivity type formed in the well apart from the source layer, wherein the drain layer is applied a driving voltage between the source layer and the drain layer, and electrically connects to the deep well via the well;
a contact layer of the second conductivity type formed outside the well in an upper layer portion of the deep well and connected to the drain layer;
a gate electrode provided in a region directly above a region between the source layer and the drain layer;
a gate insulation film provided between the well and the gate electrode; and
a drift layer of the second conductivity type formed in an upper layer portion of the well between the drain layer and a region directly below the gate electrode, wherein the drift layer has an effective impurity dose amount lower than an effective impurity dose amount of the drain layer.

2. The device according to claim 1, wherein the driving voltage is lower than a junction breakdown voltage between the drain layer and the well.

3. The device according to claim 1, further comprising a first conductivity-type region that is formed in a portion of an upper layer portion of the well, surrounds the source layer except the drain layer, and has an effective impurity dose amount higher than that of the well.

4. The device according to claim 3, further comprising another contact layer of the first conductivity type formed in a portion of an upper layer portion of the first conductivity-type region and connected to the source layer.

5. The device according to claim 3, wherein the well exists between the drift layer and the first conductivity-type region.

6. The device according to claim 3, wherein the drift layer contacts the first conductivity-type region.

7. The device according to claim 3, further comprising a second well of the first conductivity type, formed in the well in a portion of a region directly below the first conductivity-type region to contact the first conductivity-type region, having an effective impurity concentration higher than that of the well.

8. The device according to claim 1, wherein an effective impurity concentration of the contact layer is higher than an effective impurity concentration of the deep well.

9. The device according to claim 1, wherein the driving voltage is a reverse-biased voltage applied to the source layer and the drain layer, the voltage forming a first depletion layer in each of the drain layer and the well and a second depletion layer in each of the well and the deep well, such that punch through does not occur between the source layer and the drain layer, and the first depletion layer connects the second depletion layer.

10. The device according to claim 9, wherein an equipotential surface is formed from the deep well to a region depleted in each of the well, the drain layer, and the drift layer when the driving voltage is applied to the source layer and the drain layer.

11. The device according to claim 1, wherein a second conductivity-type transistor having the well, the source layer, the contact layer, the drain layer, the drift layer, the gate electrode, and the gate insulation film is a high-side transistor of a DC-DC converter.

12. The device according to claim 1, further comprising:
another well of the first conductivity type formed in a portion of an upper layer portion of the deep well;
another source layer of the second conductivity type formed in the other well;
another drain layer of the second conductivity type formed in the other well apart from the other source layer;
another gate electrode provided in a region directly above a region between the other source layer and the other drain layer;
another gate insulation film provided between the other well and the other gate electrode; and
another drift layer of the second conductivity type formed in an upper layer portion of the other well between the other drain layer and a region directly below the other gate electrode, the other drift layer having an effective impurity dose amount lower than an effective impurity dose amount of the other drain layer.

13. The device according to claim 12, wherein
a second conductivity-type transistor having the well, the source layer, the contact layer, the drain layer, the drift layer, the gate electrode, and the gate insulation film is a high-side transistor of a DC-DC converter, and
a second conductivity-type transistor having the other well, the other source layer, the other drain layer, the other drift layer, the other gate electrode, and the other gate insulation film is a low-side transistor of the DC-DC converter.

14. The device according to claim 12, further comprising
another deep well of the second conductivity type formed in a region directly below the entire other drain layer and a portion of the other drift layer on the other drain layer side, and
yet another deep well of the first conductivity type formed in a region directly below the other deep well to contact the deep well.

15. The device according to claim 12, wherein a depth and a dose amount of each of the other well, the other source layer, the other drain layer, and the other drift layer are the same as a depth and a dose amount of each of the well, the source layer, the drain layer, and the drift layer, respectively.

16. The device according to claim 12, further comprising another first conductivity-type region that is formed in a portion of an upper layer portion of the other well, surrounds the other source layer, does not surround the other drain layer, and has an effective impurity dose amount higher than that of the other well.

17. The device according to claim 1, wherein an effective impurity dose amount of a portion of the well corresponding to a region directly below the drain layer is lower than an effective impurity dose amount of a portion of the well corresponding to a region directly below the source layer.

18. The device according to claim 1, wherein
the deep well is divided into a region on the drain layer side and a region on the source layer side, an effective impurity concentration of the region of the deep well on the drain layer side being higher than an effective impurity concentration of the region of the deep well on the source layer side, and
the well is divided into a region on the drain layer side and a region on the source layer side, an effective impurity concentration of the region of the well on the drain layer side being lower than an effective impurity concentration of a region of the well on the source layer side.

19. The device according to claim 1, further comprising a second conductivity-type region that is provided between the drain layer and the deep well, is surrounded by the well, and does not contact the drain layer and the deep well.

20. The device according to claim 1, wherein the first conductivity type is a P-type.

* * * * *